(12) United States Patent
Allen et al.

(10) Patent No.: US 6,537,606 B2
(45) Date of Patent: Mar. 25, 2003

(54) SYSTEM AND METHOD FOR IMPROVING THIN FILMS BY GAS CLUSTER ION BEAM PROCESSING

(75) Inventors: Lisa P. Allen, Beverly, MA (US); David B. Fenner, Westford, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/902,306

(22) Filed: Jul. 10, 2001

(65) Prior Publication Data

US 2002/0014407 A1 Feb. 7, 2002

Related U.S. Application Data

(60) Provisional application No. 60/217,196, filed on Jul. 10, 2000.

(51) Int. Cl.$^7$ ............ B05D 1/00; C23C 14/02; C23C 16/00; B05C 11/00; B44C 1/22
(52) U.S. Cl. .............. 427/9; 427/8; 427/534; 204/192.11; 204/192.34; 204/298.04; 204/298.36; 118/723 CB; 118/712; 118/664; 118/688; 216/38; 216/59; 216/66
(58) Field of Search ............ 204/192.11, 192.34, 204/298.04, 298.03, 298.07, 298.23, 298.36, 298.32; 118/712, 664, 688, 723 CB; 427/8, 9, 534; 216/38, 59, 66

(56) References Cited

U.S. PATENT DOCUMENTS

| | | | |
|---|---|---|---|
| 4,906,594 A | * | 3/1990 | Yoneda et al. ............ 437/228 |
| 5,814,194 A | * | 9/1998 | Deguchi et al. ......... 204/192.1 |
| 5,953,578 A | * | 9/1999 | Lee ........................... 438/9 |

* cited by examiner

*Primary Examiner*—Steven H. VerSteeg
(74) *Attorney, Agent, or Firm*—Perkins, Smith & Cohen LLP; Jerry Cohen

(57) ABSTRACT

The present invention provides apparatus and methods to carry out the task of both reducing the surface roughness (smoothing) and improving the thickness uniformity of, preferably, but not limited thereto, the top silicon film of a silicon-on-insulator (SOI) wafer or similar thin-film electronic and photonic materials (workpiece). It also provides a method and apparatus for smoothing the surface of a (preferably) SOI wafer (workpiece) and for making the surface of the silicon film of a (preferably) SOI wafer cleaner and more free from contaminants.

40 Claims, 17 Drawing Sheets

— Below Calculated Mean
+ Above Calculated Mean

SYSTEM AND METHOD FOR IMPROVING THIN FILMS BY GAS CLUSTER ION BEAM PROCESSING

CROSS REFERENCE TO RELATED APPLICATIONS

This application claims priority of the U.S. Provisional Application Ser. No. 60/217,196 filed Jul. 10, 2000 entitled SYSTEM AND METHOD FOR IMPROVING THIN FILMS BY GAS CLUSTER ION BEAM PROCESSING.

STATEMENT OF GOVERNMENT INTEREST

This invention was made with U.S. Government support from the AFRL/MLKN USAF/AFMC Air Force Research Laboratory under Contract No. F33615-99-C-5411. The U.S. Government has certain rights in the invention.

BACKGROUND OF THE INVENTION

This invention relates generally to the smoothing of thin films, and, more particularly to the smoothing and uniformity enhancement of thin films on insulators by a gas cluster ion beam (GCIB) apparatus.

Growth in integration and power consumption levels of integrated circuits (ICs) and the increase in space and portable electronics applications have stimulated significant efforts in the area of radiation hardened, low power electronics (LPE). Special technology and circuit architecture is under investigation for implementation of radiation hard LPE which operate at low supply voltages and consume low power levels without sacrificing performance. Silicon-On-Insulator (SOI) substrates have advantages which make it attractive for applications that require tolerance to radiation effects. In addition, use of SOI is a primary approach to simultaneously achieve the increased circuit density, reduced power consumption, and improved performance of SRAM's in a cost effective and timely manner. Recent advances in SOI applications include radiation-hardened memories for space applications, Bi-CMOS, low power electronics, analog and digital circuitry, smart power devices, as well as high-temperature (>350° C.) and cryogenic applications. Such applications for SOI material have made use of the substrates widespread.

There are many SOI substrate (wafer) types available on the market today. For example, the SOI wafer may be fabricated by several methods—separation-by-implanted-oxygen (SIMOX) SOI, various forms of bond-and-etch-back SOI (BE-SOI), hydrogen-implant-and-release silicon (also known as SMART CUT® SOI, "SMART CUT" is a registered trademark of S.O.I. TEC Silicon On Insulator Technologies S.A.), or by plasma implanting oxygen into silicon, etc. SIMOX and BE-SOI are the most widely used SOI materials, but Smart Cut® SOI is becoming more widespread. Great simplification and consequent reduction in semiconductor fabrication costs would be achieved during fabrication of many products if the starting SOI substrate wafers were consistent from wafer to wafer and/or batch to batch.

A significant problem encountered in the commercial application of SOI substrates is the inconsistency of the gate oxide integrity (GOI) and the buried oxide integrity of CMOS circuitry. For large-scale integration, consistency in gate oxide characteristics and intrinsic break down voltages of the buried oxide are required for device and circuit operating consistency. The general threshold-voltage uniformity of SOI devices would be greatly assisted if the starting ultra-thin silicon layer could be uniform to less than 25 angstroms (Å) across an SOI wafer. The inconsistency of the gate-oxide integrity has been attributed in large part to the starting SOI-wafer surface roughness. General threshold-voltage uniformity of transistor devices fabricated from SOI wafers is dependent upon the thickness uniformity of the overlying (top) silicon layer (thin film).

Thus, a major issue that must be addressed is the surface quality of the top, ultra-thin silicon layer on SOI substrates or other types of thin film substrates. Surface roughness (spatially varying topography) is typically measured by analysis of measurements formed with an atomic force microscope (AFM), imaging optical interferometer, or a transmission-electron microscope (TEM). The thickness uniformity of the silicon film can be observed by the unaided eye as color fringes for any non-uniformity greater than about 25 Å. For greater precision, an imaging optical interferometer, a mapping spectroscopic ellipsometer can be employed. While bulk silicon wafers, such as utilized in standard IC manufacturing, have surface roughness of typically less than 1 Å, SOI wafers are known to have a minimum surface roughness of about 3 Å to 50 Å, across the wafer in the final state of SOI fabrication. This non-uniformity is consistent within a lot or "batch" of wafers with the same lot number, i.e., the same manufacturing run. In the case of SIMOX, the surface roughness and non-uniformity is caused by the oxygen-ion implantation process, whereby a mono-energetic beam of oxygen atoms and molecules is implanted ~200 nm below the original surface of a silicon wafer, as well as the required subsequent thermal anneal to heal defects deep in the thin film. In the case of BE-SOI, the surface roughness and non-uniformity are caused by an etch-back process that inherently leaves substantial non-uniformity of the silicon layer unless extraordinary steps are taken. In the case of the SMART CUT® SOI, a cleavage process (following the hydrogen implant) leaves many atomic steps on the silicon surface. Early indications of the plasma implantation process of SOI substrate fabrication reveal sub-surface damage and non-uniformity of the silicon and insulating layers due to the random ionization charges of the penetrating oxygen ions.

Silicon-on-insulator material poses unique problems for smoothing of the silicon surface. The method applied to smooth or provide uniform silicon layers must not contribute significant quantities of metal contamination, (typically required to be less than $9 \times 10^{10}$ atoms/cm2 total metal content), and must remove a minimal of surface silicon so as to avoid removing the thin silicon layer. Traditional bulk smoothing methods, while satisfactory for silicon films on the order of microns thick, cannot be applied to SOI films having silicon as thin as 10 to 20 nm, such as will likely be required for advanced devices.

Historically, plasma polishing has been used to reduce roughness of silicon in the semiconductor field, but owing to non-uniformity and sub-surface damage associated with plasma polishing, touch polishing has largely replaced plasma polishing in the more critical applications.

A recent study (W. Maszara, et al., Quality of SOI film after surface smoothing with H annealing, touch polishing, Proc. 1997 IEEE Int'l. SOI Conf., Oct. 6–9, 1997, p. 130) of gate oxide integrity on SOI wafers implemented hydrogen annealing and touch polishing in order to examine the effect of surface roughness on gate oxide integrity. For example, an 1150° C./1 hour hydrogen anneal removed ~10 nm to 15 nm of Si from the surface, and their touch polish method removed ~50 nm to 75 nm of silicon. For a 50 nm to 200 nm thick silicon layer of SIMOX, such a large amount of silicon removal is significant and, in most commercial use cases, unacceptable. Maszara concluded that the SOI surface thickness variation is presently on the order of 0.3 nm to 1.5 nm. This constitutes as much as 15% thickness variation of a 10 nm gate oxide, and the resulting gate threshold voltage variations are likely to be unsuitable for advanced circuitry. Furthermore, the surface roughness of the SOI structure may provide dangling silicon bonds that contribute to surface charges trapped in the gate oxide/silicon interface. These may, in turn, affect the radiation hardness or general threshold voltage behavior of the circuitry.

The concept of using GCIB's for dry etching, cleaning, and smoothing of hard materials is known in the art and has been described by Deguchi, et al. in U.S. Pat. No. 5,814,194, "Substrate Surface Treatment Method", 1998. Because ionized clusters containing on the order of thousands of gas atoms or molecules may be formed and accelerated to modest energies on the order of a few thousands of electron volts, individual atoms or molecules in the clusters each only have an average energy on the order of a few electron volts. It is known from the teachings of Yamada, U.S. Pat. No. 5,459,326, that such individual atoms are not energetic enough to significantly penetrate a surface to cause the residual sub-surface damage typically associated with plasma polishing. Nevertheless, the clusters themselves are sufficiently energetic (some thousands of electron volts) to effectively etch, smooth, or clean hard surfaces.

Because the energies of individual atoms within a gas cluster ion are very small, typically a few eV or less, the atoms penetrate through only a few monolayers, at most, of a target surface during impact. All of the energy carried by the entire cluster ion is consequently deposited into an extremely small volume at the impact site during a period as short as about 10–12 second. Because of the high total energy of the cluster ion and extremely small interaction volume, the deposited energy density at the impact site is far greater than in the case of bombardment by conventional ions and resulting thermal spike conditions are greatly enhanced. Computer simulations have suggested instantaneous temperatures of the order of 105 oK together with megabar instantaneous pressures at cluster ion impact sites. The extreme instantaneous temperature and pressure conditions, in combination with intimate mixing between gas atoms from the cluster ion and the target material atoms, is considered to be responsible for highly enhanced chemical reaction effects. Enhanced chemical reaction effects previously reported have included oxidation effects produced by O2 and CO2 cluster ions. SiO2 dielectric layers of controllable thickness have been successfully produced on silicon at room temperature. High quality, ultra-smooth PbO films have been deposited on glass, and high conductivity indium-tin-oxide transparent conductor films have been deposited at room temperature.

It is therefore an object of this invention to provide methods and apparatus for smoothing the surface of a workpiece such as a SOI wafer.

It is therefore an object of this invention to provide methods and apparatus and for making the silicon film of an SOI wafer more uniform in thickness.

It is a further object of this invention to provide methods and apparatus for making the surface of a workpiece such as, for example, the silicon film of an SOI wafer cleaner and more free from contaminants.

SUMMARY OF THE INVENTION

The objects set forth above as well as further and other objects and advantages of the present invention are achieved by the embodiments of the invention described hereinbelow.

The present invention provides apparatus and methods to carry out the task of both reducing the surface roughness (smoothing) and improving the thickness uniformity of a workpiece, preferably, but not limited thereto, the top silicon film of a silicon-on-insulator (SOI) wafer or similar thin-film electronic and photonic materials. The invention also provides methods and apparatus for smoothing the surface of a workpiece, preferably, but not limited to a SOI wafer and for making the surface of the workpiece such as a silicon film of, preferably, a SOI wafer cleaner and more free from contaminants. The SOI may be any of the following types: the separation-by-implanted-oxygen (SIMOX), bond-and-etch-back (BE-SOI), or hydrogen-implant-and-release silicon (also known as SMART CUT® SOI), as well as other types of SOI material, all of which pose unique challenges due to the required thinness and uniformity of the silicon layer, together with its high crystalline quality, very high purity, and lack of surface roughness.

The invention utilizes a vacuum GCIB etching and smoothing process and includes a GCIB apparatus that irradiates the SOI wafer surface. Measurements performed upon the workpiece provide information on the roughness and thickness non-uniformity and on processing induced changes in roughness and thickness non-uniformity. The information is fed back to control processing by the GCIB apparatus to improve the surface until desired surface characteristics have been obtained.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
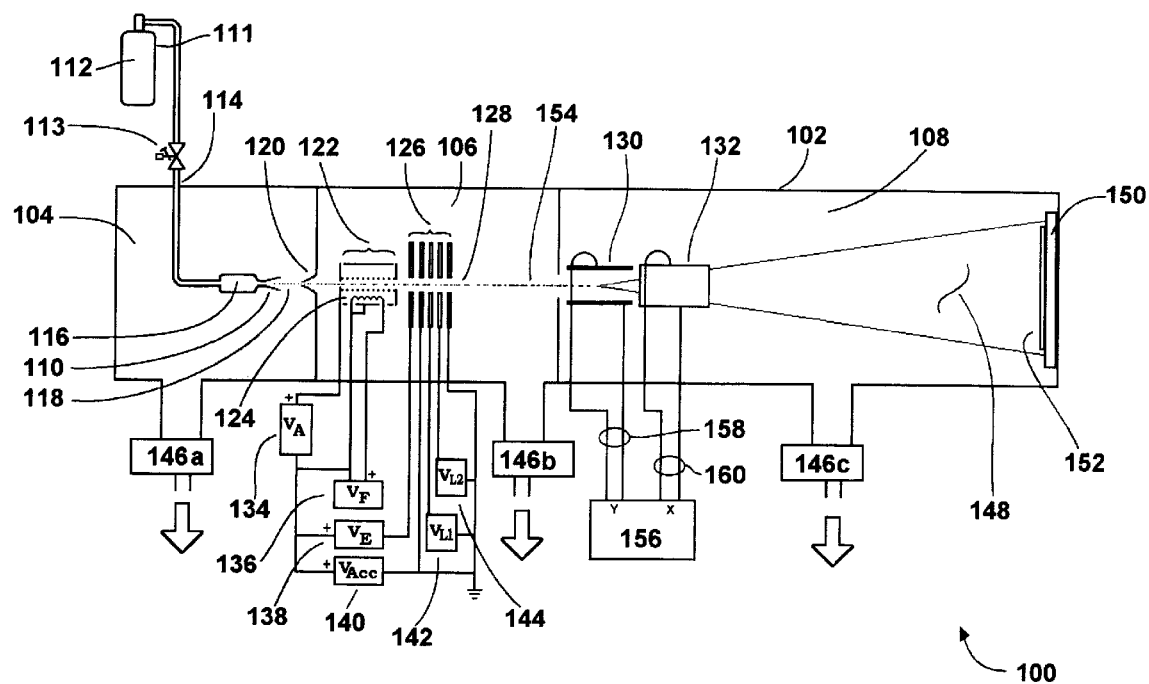
FIG. 1 is a schematic showing the basic elements of a prior art GCIB processing system.

FIG. 1 shows a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c respectively. A condensable source gas 112 (for example argon or N2) stored in cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates any gas molecules that have not condensed into clusters from those that have condensed and become part of a cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from some of the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having an initial trajectory 154. Filament power supply 136 provides voltage VF to heat the ionizer filament 124. Anode power supply 134 provides voltage VA to accelerate thermoelectrons emitted from filament 124 to cause them to bombard the cluster containing gas jet 118 to produce ions. Extraction power supply 138 provides voltage VE to bias a high voltage electrode to extract ions from the ionizing region of ionizer 122 and to form a GCIB 128. Accelerator power supply 140 provides voltage VAcc to bias a high voltage electrode with respect to the ionizer 122 so as to result in a total GCIB acceleration energy equal to VAcc electron volts (eV). One or more lens power supplies (142 and 144 shown for example) may be provided to bias high voltage electrodes with potentials (VL1 and VL2 for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, a scan generator 156 provides X-axis and Y-axis scanning signal voltages to the pairs of scan plates 130 and 132 through lead pairs 158 and 160 respectively. The scanning signal voltages are commonly triangular waves of different frequencies that cause the GCIB 128 to be converted into a scanned GCIB 148, which scans the entire surface of workpiece 152.

The present invention is described below incorporated within a typical GCIB apparatus of the type shown in FIG. 1 of the drawings. However, it should be understood that this invention can also be incorporated within other GCIB apparatus as well. Furthermore, although the present invention finds its primary application in smoothing and/or cleaning SOI wafers, it can be utilized with a wide variety of other wafers or the like, all of which will also be referred to herein as a workpiece or workpieces.

Figure 2A:
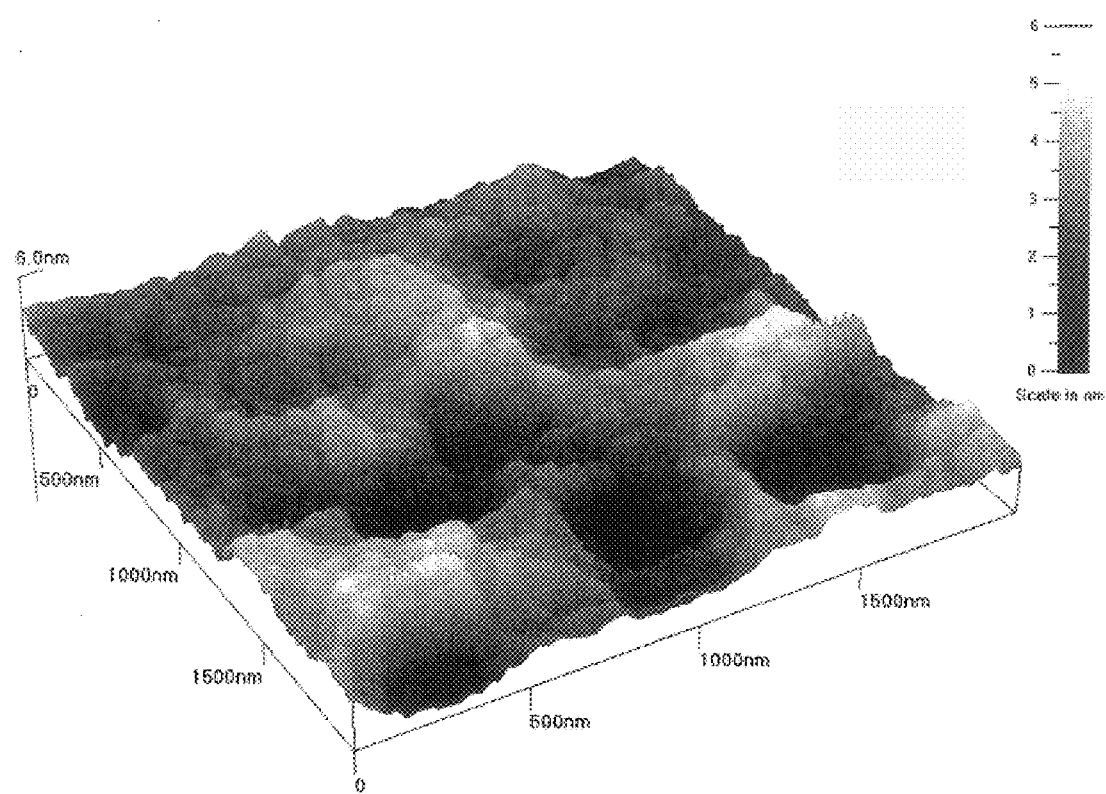
FIG. 2A shows a prior art atomic force microscope image showing faceting and surface roughness of as-fabricated SIMOX type SOI.
Figure 2B:
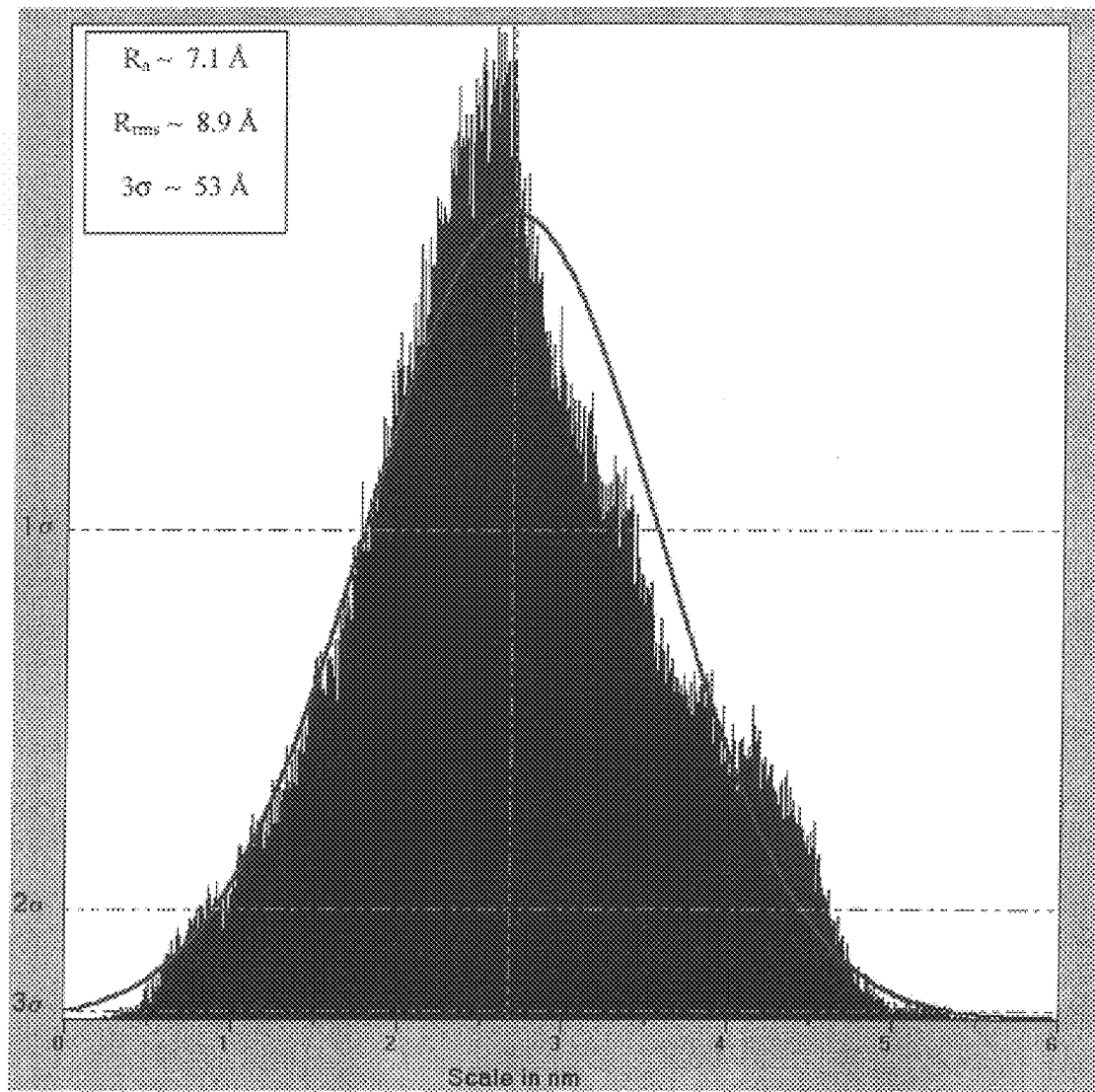
FIG. 2B shows a prior art histogram of atomic force microscope image amplitude values showing average roughness (Ra), root-mean-square roughness, (Rrms), and 3-sigma range of as-fabricated SIMOX type SOI.
Figure 2C:
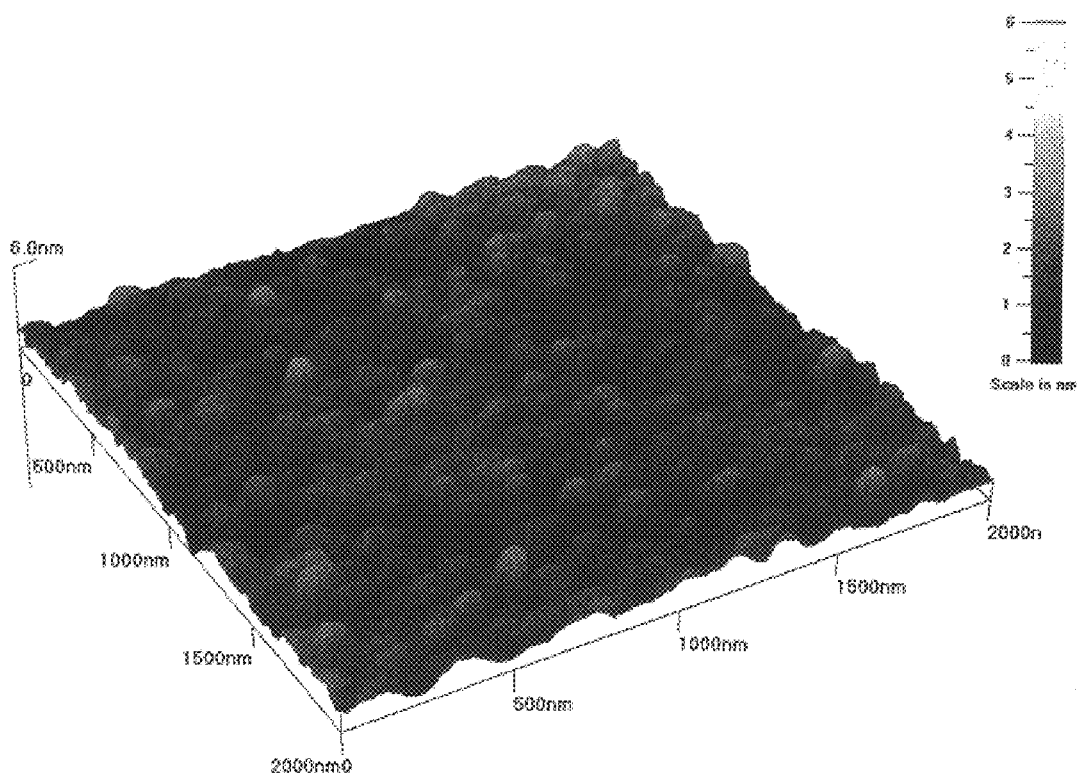
FIG. 2C is a prior art atomic force microscope image showing roughness reduction on the SIMOX SOI surface (same as FIG. 2A) after prior art GCIB processing (same scale as FIG. 2A)
Figure 2D:
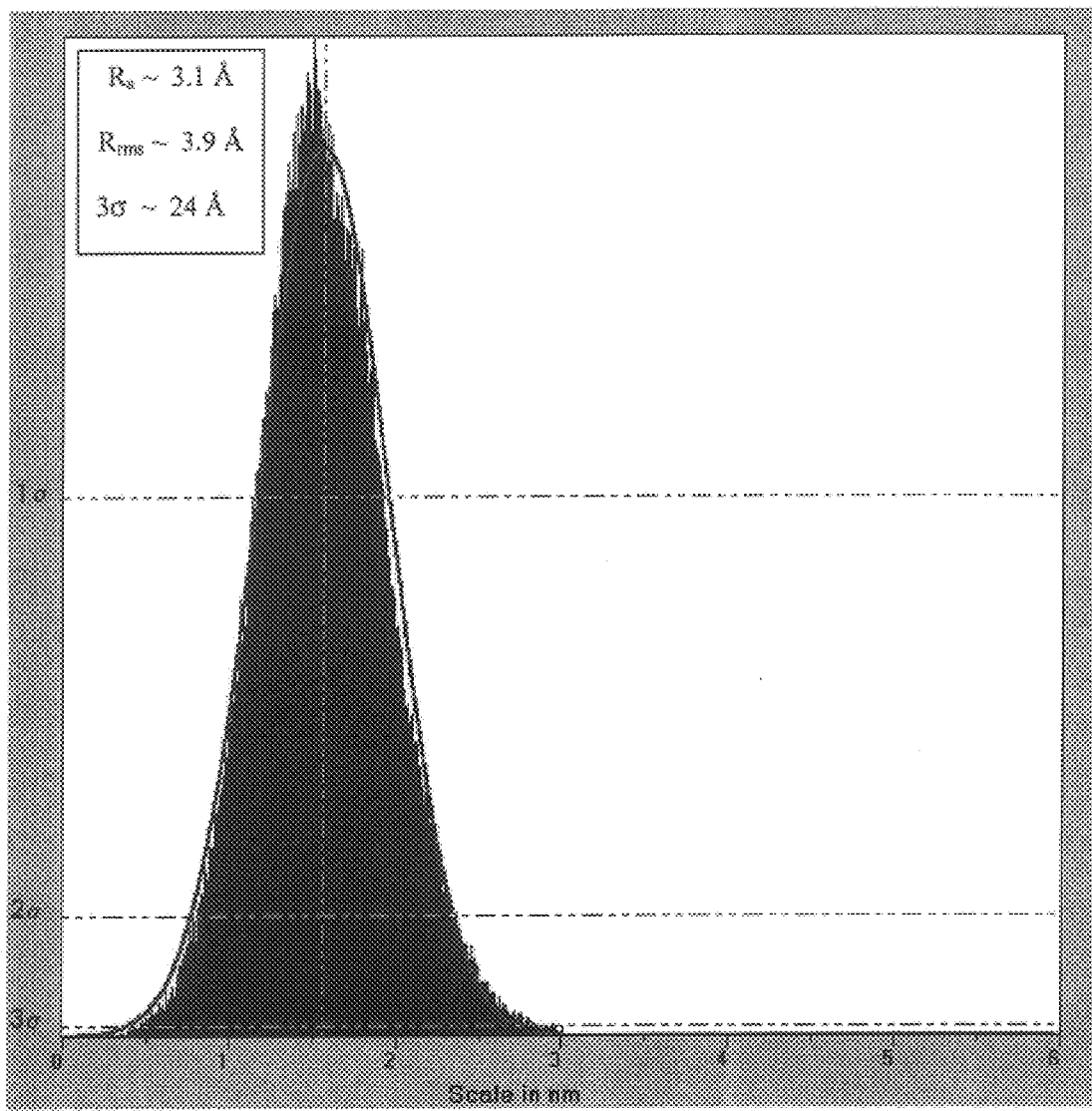
FIG. 2D is a prior art histogram of atomic force microscope measured amplitude values showing reduction of Ra, Rrms, and 3-sigma range roughness on the SIMOX SOI surface (as in FIG. 2B) after prior art GCIB processing.

Prior art FIGS. 2A through 2D of the drawings show the before and after characteristics of a 2 micron square area of an SOI surface processed using a high-energy (20 keV) argon GCIB process on typical SOI material. The atomic force microscope (AFM) image of FIG. 2A indicates that before GCIB processing, the surface exhibited faceting and a relatively large small-scale roughness. FIG. 2B shows prior to GCIB processing, the peak-to-valley surface roughness (3-sigma) for the 2 micron area was 53 Å and the average roughness, Ra was 7.1 Å and the root-mean-square roughness, Rrms was 8.9 Å. FIG. 2C is an AFM image made after prior art 20 keV argon processing and shows a surface with improved small-scale roughness. FIG. 2D shows that with the high-energy (20 keV) GCIB processing, the peak-to-valley surface roughness (3-sigma) for the 2 micron area was reduced from 53 Å to 24 Å. Similarly, the Ra was reduced from 7.1 Å to 3.1 Å and the Rrms from 8.9 Å to 3.9 Å. Optical measurements revealed that ~350 Å of surface silicon was removed with the selected parameters for the GCIB process, sufficient for surface smoothing.

Figure 3:
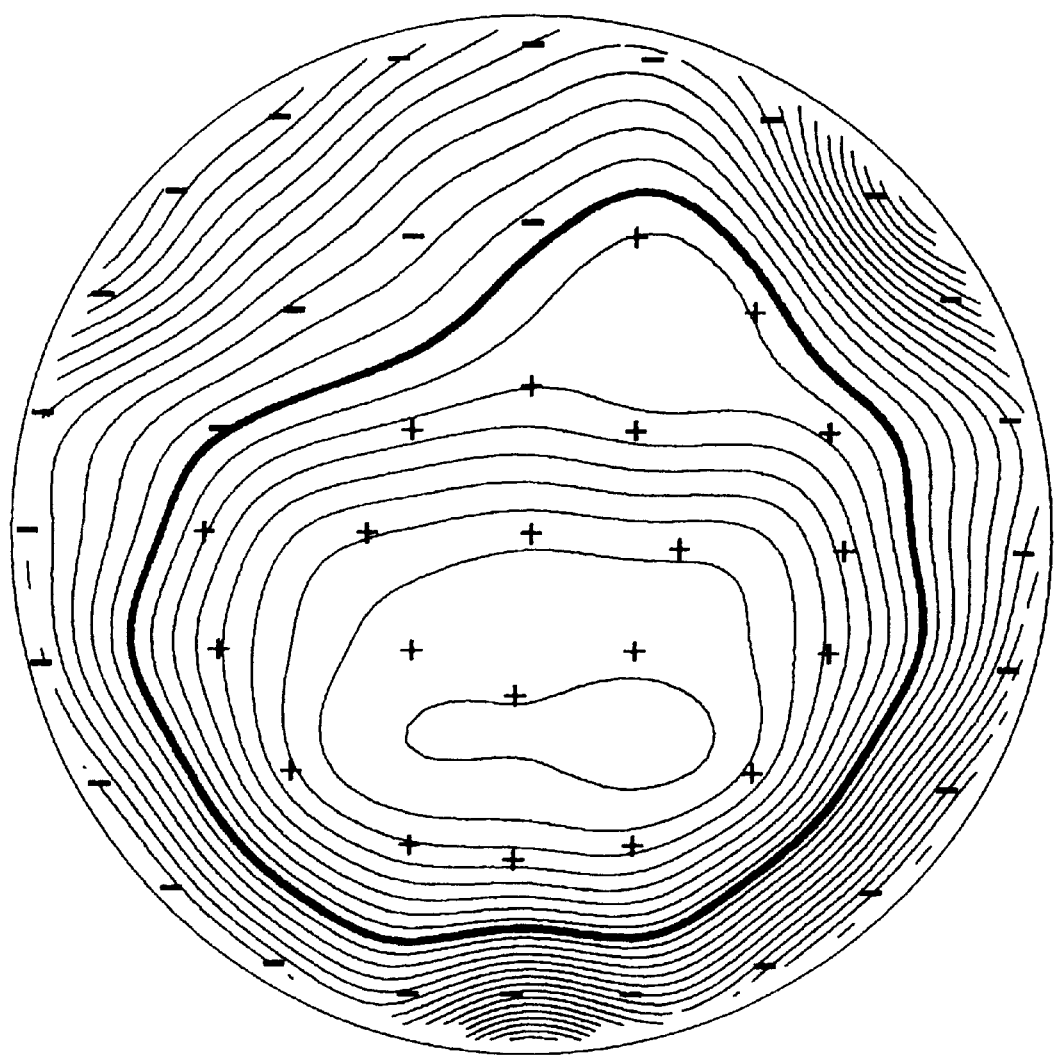
FIG. 3 shows a prior art spectroscopic ellipsometry film-thickness map of a SIMOX SOI wafer.

FIG. 3 shows a prior art SOI film-thickness map of a SIMOX SOI wafer as measured by spectroscopic ellipsometry using a commercially available model UV-1280SE thin film measurement instrument manufactured by KLA-Tencor Corporation. The figure illustrates the ability to map the thickness of a thin film (SOI) on a substrate as a function of position. Such measurements can be done to within a precision of a few Å or better.

The present invention modifies known GCIB processing techniques to create substantial improvements in surface smoothness and surface layer thickness uniformity, and may incorporate the use of a low-energy GCIB process following a high-energy process or using a low-energy process in place of the high-energy process to achieve a significant reduction of the SOI surface roughness. The present invention also modifies known GCIB processing to simultaneously smooth the surface of an SOI surface and to getter and remove impurities.

Simulations have shown (see T. Aoki, et al., "Molecular dynamics simulation of damage formation by cluster ion impact", Nuclear Instr. and Methods B, 121 (1997) 49) that ultra-shallow surface processing is possible when low energy is used for GCIB processing. These and other computer simulations have suggested that 0.05 nm to 0.1 nm (0.5 to 1.0 Å) surface smoothness may be attained using a low (1–5 keV) energy GCIB process, due to the ultra-shallow surface interaction of the low energy and high atomic cluster combination. GCIB smoothing of SOI and other thin film overlayer material provides for ultra-shallow surface modification when low energies (energies less than or equal to 10 keV) are used. Unlike chemical mechanical polishing, touch polishing, hydrogen annealing, plasma smoothing, and high-energy GCIB processing, which all remove unacceptably large amounts of surface atoms in attempts to achieve an adequately smooth SOI layer, and/or which cause near-surface damage and contamination, the use of low-energy GCIB processing according to this invention is able to produce a smoothness comparable to that of the best available bulk silicon substrates while removing as little as a few atomic layers. Due to the ultra-shallow surface processing achieved with the GCIB process of this invention, as much as 500 Å or more, if required, to as little as 1 Å may be removed from the surface.

The amount of material removed by GCIB processing is dose and energy dependent and with higher doses or energies, as much as several microns may be removed from a particular SOI surface, if required for smoothing or for adjusting the thickness of the film. The amount of material that must be removed from the surface for smoothing is dependent upon the initial roughness of the starting SOI (or other thin film) over-layer. When it is desired to adjust the thickness of a surface film to make it more spatially uniform in thickness, the amount that must be removed generally varies as a function of position on the wafer surface as may be shown in a measurement map similar to that of FIG. 3.

The principles of operation of the present invention, which overcome the shortcomings of prior smoothing techniques, are described in detail below. With the system of this invention, a beam of ionized clusters (which are charged and range in size from approximately a few to several thousand atoms or molecules per cluster) impinge upon the thin film, preferably, SOI wafer surface. Inert gasses such as argon are particularly useful for forming cluster-ion beams. Essentially all condensable gasses can form cluster beams, but most commonly utilized are argon, oxygen, nitrogen, and carbon dioxide. The cluster ions break apart at the wafer surface upon impact and smooth out the topographic irregularities, including those caused by the original SOI fabrication processing. In the smoothing process, it is inevitable that the top silicon film is reduced in thickness (i.e., thinned) by what is essentially a type of ion-etching process that also produces smoothing (unlike conventional ion beam etching or milling). For typical surfaces, increasing the cluster ion beam dose results in a monotonically decreasing roughness that approaches an asymptote when the dose is large. Also, a few times the initial average roughness, Ra, must be etched away in order for the smoothing process to progress substantially toward its asymptotic smoothing limit, i.e., the limit reached for an arbitrarily long exposure to the GCIB. Since the GCIB is charged, the dose can be measured by conventional current measurement techniques that may, but do not necessarily, include the use of a Faraday cup to collect beam current. In previous scanning of GCIB's, electrostatic scanning apparatus has been used to move a GCIB beam spot over a workpiece surface and thereby process areas larger than the beam spot itself, and such method may be used with the present invention. However, the use of a stationary GCIB and a mechanical means for translating the workpiece through the beam is preferred for the present invention. Typically, in previous GCIB scanning applications, considerable care was taken to employ a beam-scan pattern that results in a high degree of uniformity in the dose delivered to all parts of the surface being processed. Electrostatic scanning was usually implemented by two pair of scan plates, the X-axis and the Y-axis (where the Z-axis is the beam direction) plates, and variable voltages are impressed upon those plates. These voltages have historically been varied in accordance with a predetermined scheme for producing a rectangular raster pattern of beam displacement in X-Y directions at the plane of the workpiece.

In the present invention, scanning may employ electrostatic scanning for deflecting the GCIB over the surface of the workpiece or, preferably, a mechanical scanning method for moving the workpiece relative to the beam. In the present invention, the workpiece and the GCIB move relative to each other so as to provide different processing doses at different positions on the surface of the workpiece, resulting in differing amounts of etching, as required to restore thickness uniformity to the surface. In the preferred embodiment, the relative motion between beam and workpiece is achieved by scanning, preferably mechanically, but not limited thereto, the workpiece with respect to a substantially stationary beam, using a raster or like scanning motion that has been pre-arranged so as to provide varying dwell times of the beam at different regions of the workpiece surface, while maintaining the GCIB beam intensity substantially constant. The effect of the specifically profiled GCIB exposure will be to remove less silicon (or other overlying film) material at the initially thinner wafer-surface areas, and to remove more silicon (or other overlying film) material at the initially thicker wafer-surface areas, thus specifically and individually processing the surface film so as to attain uniformity in the film thickness while simultaneously smoothing the micro-areas. It is important to note that the average thickness of the entire top silicon film will be reduced, at least somewhat, as a consequence of the smoothing and selectively scanned beam processing of this invention. Thus the present invention will often intentionally fabricate the initial film (top layer) of silicon with a somewhat greater average thickness than is desired for the film after being treated by the GCIB process. A relatively high GCIB energy, typically greater than 10 keV, and preferably 20–50 keV is used during this first portion of the process, which smoothes the surface, renders it more uniform in thickness, and reduces the thickness of the film.

Figure 4:
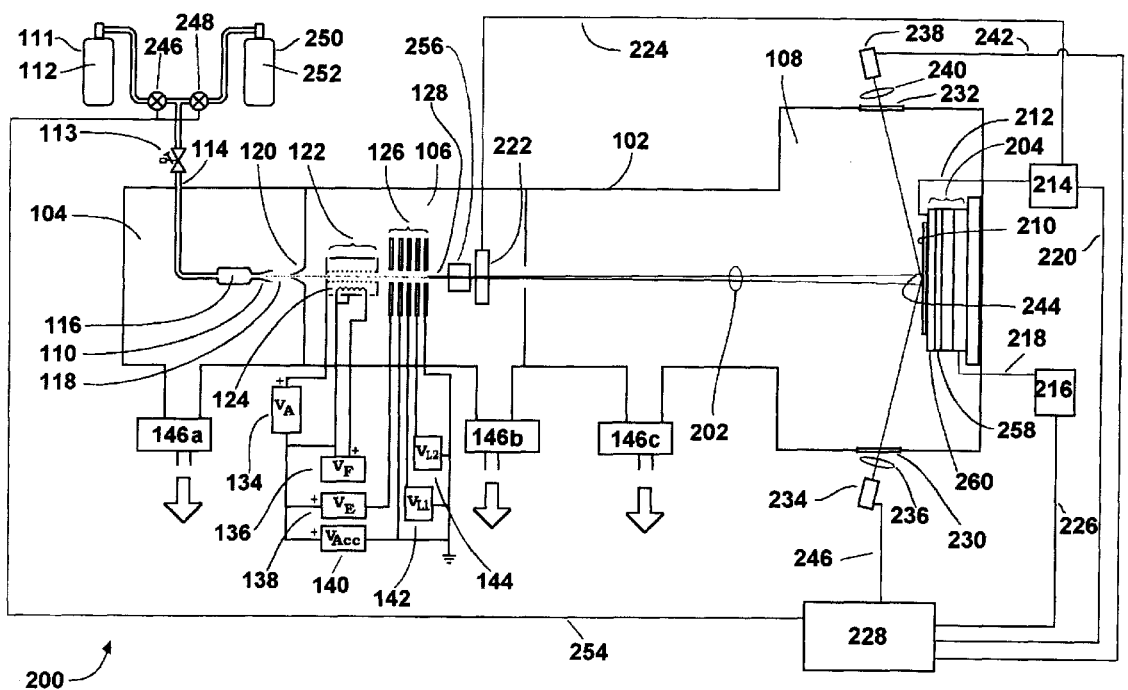
FIG. 4 is a schematic of the GCIB apparatus of this invention with in-situ process monitor capability for SOI wafers.

The initial thickness non-uniformity of the SOI substrate may be characterized ex-situ of the GCIB apparatus by spectroscopic ellipsometry or other suitable conventional techniques. Such techniques can produce a point-by-point film thickness map that may be reduced to thickness contours (or similar) as shown in FIG. 3. Similarly, an in-situ uniformity-mapping instrument using spectroscopic ellipsometry or other suitable conventional film thickness mapping techniques may be incorporated within the GCIB apparatus for guiding the profiling process of the invention, as illustrated in FIG. 4 and hereinafter described. In either case, the non-uniformity measurements may be stored as a series of thickness points with precise wafer positions by a standard computer. A film measurement method such as spectroscopic ellipsometry is used to map the thickness of only the top film layer, independent of variations in substrate thickness, thickness of underlying films, or surface flatness is required, for SOI wafers, it is primarily the top silicon film that actually participates in the construction and influences the behavior of the electronic devices, e.g., transistors. According to this invention, film thickness map information is fed into the GCIB beam-control apparatus as a data file. Using a previously measured beam removal function and a previously measured relationship between etch rate and dose for a particular set of GCIB parameters (including GCIB energy and cluster species), a mathematical algorithm is then employed which takes the non-uniformity data, inverts beam spot etching pattern to fit the non-uniformity profile, and creates a beam-dose contour to selectively remove surface material and thereby achieve a uniformly thick film. Many different approaches to the selection of mathematical algorithm may be successfully employed in this invention.

To a first approximation, the beam profile will be a gaussian function for any cross-section slice of the beam in cylindrical coordinates with the beam propagation axis as the Z-axis of the coordinate system. For the case of profiling by variations in the beam dwell time, the mathematical inversion and deconvolution that must be performed are simplified since the response function of the sample is linear with changes in dose. Hence the beam removal function has essentially the same mathematical functional shape as the beam intensity profile. The beam dwell-time map, which directly determines the beam-scan pattern, must be implemented for each systematically varying SOI batch if angstrom-scale uniformity is desired. Once processed to GCIB specifications, the uniformity of the wafer(s) may be examined either in-situ or ex-situ and the process finished or refined, iteratively, as appropriate.

According to this invention, a preferred GCIB apparatus as shown in FIG. 4 has a facility for control of the beam-scan profile by direct feedback from the non-uniformity map data, as established either in-situ or ex-situ to the GCIB apparatus. Further, the in-situ measurement method is preferred since it is the most time efficient method and it permits iteration without exposing the substrate to repeated vacuum/atmosphere cycles. Referring to the GCIB processing apparatus 200 of the invention shown in FIG. 4, a substantially stationary GCIB 202 is directed at a workpiece 210 that may be an SOI wafer or the like. Workpiece 210 is held on an X-Y positioning table 204 that is operable to move the workpiece in two axes, effectively scanning the workpiece 210 relative to the GCIB 202. The GCIB 202 impacts the workpiece 210 at a projected impact region 244 on a surface of the workpiece 210. By X-Y motion, the table 204 can position each part of a surface of the workpiece 210 in the path of GCIB 202 so that every region of a surface of workpiece 210 may be made to coincide with the projected impact region 244 for processing by the GCIB. An X-Y controller 216 provides electrical signals to the X-Y positioning table 204 through electrical cable 218 for controlling the position and velocity in each of X-axis and Y-axis directions. The X-Y controller 216 receives control signals from and is operable by system controller 228 through cable 226. X-Y positioning table 204 moves by continuous motion or by stepwise motion according to conventional X-Y table positioning technology to position different regions of the workpiece 210 within the projected impact region 244. In the preferred arrangement, X-Y positioning table 204 is programmably operable by the system controller 228 to scan, with programmable velocity, any portion of the workpiece 210 through the projected impact region 244 for GCIB processing by the GCIB 202. The workpiece holding surface 260 of positioning table 204 is electrically conductive and is connected to a conventional dosimetry processor 214 by electrical lead 212. An electrically insulating layer 258 of positioning table 204 isolates the workpiece 210 and workpiece holding surface 260 from the other portions of the positioning table 204. Electrical charge induced in the workpiece by the GCIB 202 striking workpiece 210 is conducted through workpiece 210, workpiece holding surface 260, and electrical lead 212 to the dosimetry processor 214 for measurement. Dosimetry processor 214 has integrating means for integrating GCIB current to determine GCIB processing dose. It is recognized that in some cases it is desirable to use a target-neutralizing source (not shown) of electrons (sometimes referred to as electron flood). In such case, a faraday cup (also not shown) may be used to assure accurate dosimetry despite the added source of electrical charge. A beam gate 222 is disposed in the path of GCIB 202. Beam gate 222 has an open state and a closed state. A control cable 224 conducts control signals from dosimetry processor 214 to beam gate 222, said control signals controllably switching beam gate 222 to either of its open or closed states for enabling or disabling GCIB processing of workpiece 210. The processing chamber 108 has two optical windows 230 and 232 respectively. An optical transmitting transducer 234 that may also have additional transmitting optics 236 and an optical receiving transducer 238 that may also have additional receiving optics 240 form a conventional optical instrumentation system. The optical instrumentation system's transmitting transducer 234 receives and is responsive to controlling electrical signals from the system controller through electrical cable 246 and the optical instrumentation system's receiving transducer 238 sends measurement signals to the system controller through electrical cable 242.

The optical instrumentation system may comprise any of a variety of different instruments for measuring the progress of the GCIB processing. For example, the optical instrumentation system may constitute a spectroscopic ellipsometry system for measuring or mapping the thickness of the upper film layer (preferably SOI) of the workpiece, similar to that used to produce the map of FIG. 3. As another example, the optical instrumentation system may comprise a scatterometer for measuring or mapping the smoothness of the workpiece surface, using measurement techniques similar to those employed by Dandliker et al. in U.S. Pat. No. 3,922,093. By operating under control of the system controller 228 and in conjunction with the X-Y positioning table 204 the optical instrumentation can map one or more characteristics of the workpiece. The GCIB processing apparatus of the invention has a conventional source gas cylinder 111 for containing an inert source gas 112, argon or the like. It has a second gas cylinder 250 for containing a reactive gas 252, that may be for example but not for limitation oxygen, nitrogen, carbon dioxide, nitric oxide, nitrous oxide, another oxygen-containing condensable gas, or sulfur hexafluoride. Two shut-off valves 246 and 248 are operable by signals transmitted through electrical cable 254 by system controller 228 to select either source gas 112 or source gas 252 for GCIB processing. A beam filter 256 is provided to eliminate monomers or monomers and light cluster ions from the GCIB. The beam filter uses conventional technology as described for example in U.S. Pat. No. 5,185,272 or U.S. Pat. No. 4,737,637.

It is recognized that the dosimetry processor 214 may be one of many conventional dose control circuits that are known in the art and may include as a part of its control systems all or part of a programmable computer system. The X-Y controller 216 may include as part of its logic all or part of a programmable computer system. The dosimetry processor 214 may include as part of its logic all or part of a programmable computer system. Some or all of the X-Y controller 216 and dosimetry processor 214 logic may be performed by a small general purpose computer that also controls other portions of the GCIB processing apparatus, including the system controller 228. In operation, the dosimetry processor 214 signals the opening of the beam gate 222 to irradiate the workpiece with the GCIB 202. The dosimetry processor 214 measures the GCIB current, Ib, collected by the workpiece 210 to compute the accumulated dose, d, received by the workpiece 210. When the dose, d, received by the workpiece 210 reaches a predetermined required dose, the dose processor closes the beam gate and processing of the workpiece 210 is complete. During processing of the workpiece 210, the dose rate is communicated by the dosimetry processor 214 to the system controller 228 by electrical signals on electrical cable 220, to confirm that the GCIB beam flux is substantially constant. The X-Y controller 216 is responsive to signals from the system controller 228 that are transmitted over electrical cable 226. The X-Y controller 216 can scan the X-Y positioning table to position every part of the workpiece 210 for processing according to predetermined velocities that result appropriate beam dwell times to etch away the desired thicknesses to provide a film of uniform thickness.

Figure 5A:
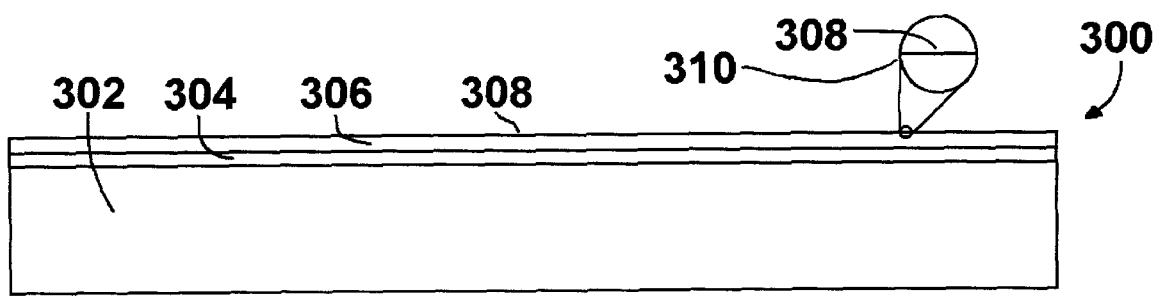
FIG. 5A is a schematic of an ideal SOI wafer having optimum smoothness.
Figure 5B:
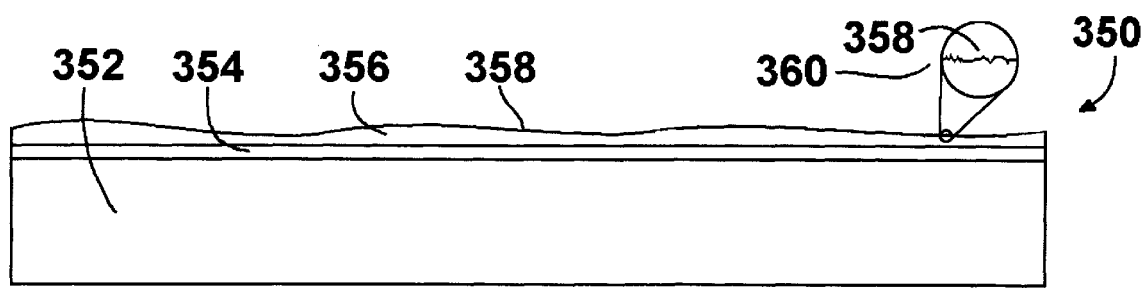
FIG. 5B is a schematic of a prior art SOI wafer having a rough and non-uniform surface layer.
Figure 5C:
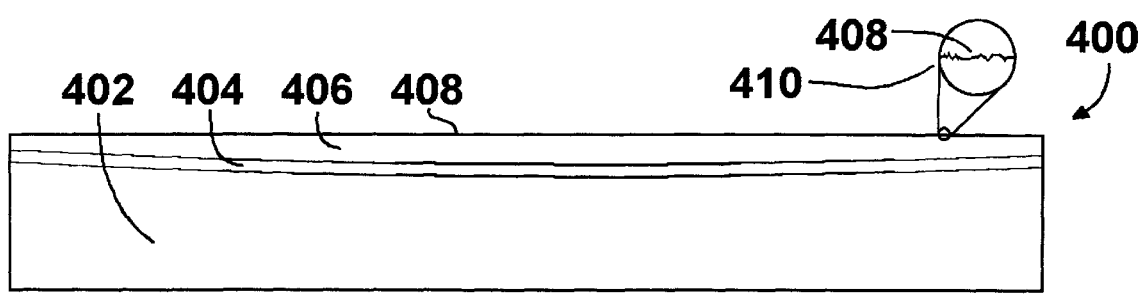
FIG. 5C is a schematic of a prior art SOI wafer having a buried layer of non-uniform depth.
Figure 5D:
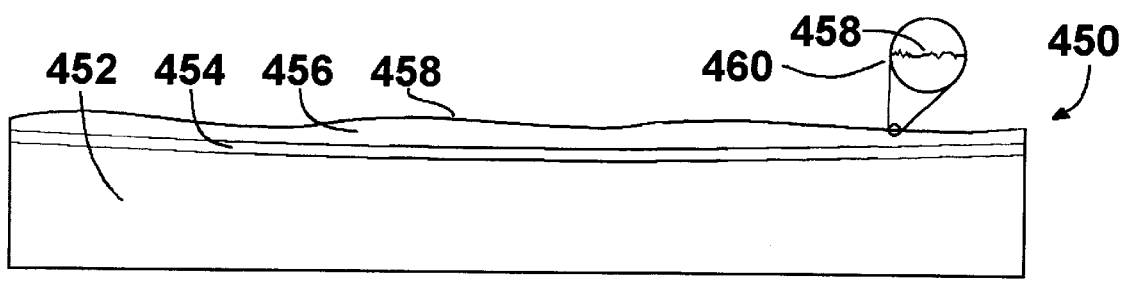
FIG. 5D is a schematic of a prior art SOI having a buried layer of non-uniform depth and a surface layer that is rough and non-uniform.
Figure 5E:
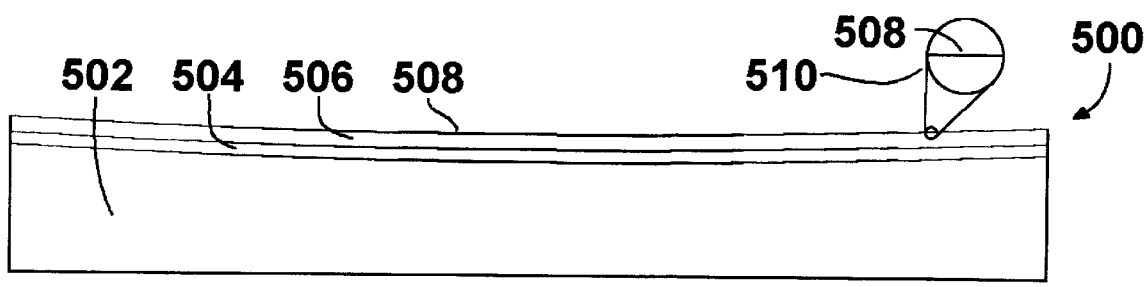
FIG. 5E is a schematic of an improved SOI wafer having a smooth, uniform surface layer resulting from the use of this invention.

"As an alternative method, a beam is scanned at constant velocity across the surface, and in a fixed pattern, but the GCIB intensity is modulated (often referred to as Z-axis modulation) and thereby deliver an intentionally non-uniform dose to the sample. The GCIB intensity may be modulated by any or a variety of methods, including for example but not limited to: by varying the GCIB source supply gas flow; by modulating the ionizer either by varying the filament voltage VF, or by varying the anode voltage VA; by modulating the lens focus by varying lens voltages VL1 and/or VL2; or by mechanically blocking a portion of the beam by means of a variable beam block, adjustable shutter, or variable aperture. The modulating variations may be continuous analog variations or time modulated switching or gating." FIG. 5A shows a schematic diagram of, for example, a cross sectional view of an ideal SOI wafer 300. A substrate 302 is silicon or like and has a buried insulator layer 304 that is silicon dioxide or like. A thin top film 306 of silicon or like is of uniform thickness and has a surface 308 that is smooth as shown in magnified view 310. FIG. 5B shows a schematic diagram of a typical as-fabricated prior art SOI wafer 350 having a common form of defect. The substrate 352 has a buried insulator layer 354 that is uniform, but the thin top film 356 is not of uniform thickness. The surface 358 is rough as shown in magnified view 360. FIG. 5C shows a schematic diagram of a typical as-fabricated prior art SOI wafer 400 having another common form of defect. The substrate 402 has a buried insulator layer 404 that is uniform in thickness, but not at a constant depth. Consequently the thin top film 406 is not of uniform thickness and cannot be made so by conventional techniques that planarize and polish the top surface. The surface 408 is rough as shown in magnified view 410. FIG. 5D shows a schematic diagram of a typical as-fabricated prior art SOI wafer 450 having both common forms of defect. The substrate 452 has a buried insulator layer 454 that is uniform in thickness, but not at a constant depth. The top film 456 has a top surface 458 that is not flat and consequently the thin top film 456 is not of uniform thickness and cannot be made so by conventional techniques that planarize and polish the top surface. The surface 458 is rough as shown in magnified view 460. FIG. 5E shows a schematic diagram of an SOI wafer 500 that was fabricated with the types of defects shown in FIG. 5C or SD. After processing by the method of the invention, the result is a substrate 502 having a buried insulator layer 504 and a thin top film 506 that is of uniform thickness and has a surface 508 that is smooth as shown in magnified view 510. For SOI wafers that are fabricated with the type of defect shown in FIG. 5B, processing by the method of the invention results in an SOI wafer that approach the ideal characteristics shown in FIG. 5A. SOI wafers having characteristics shown in 5A or in 5E are both ideal for fabricating integrated circuit or semiconductor devices because of the uniformity of the upper film and the uniformity of the buried insulator film. It should further be realized that use of the methods of this invention as described above are not limited to SOI wafers and can be used in the smoothing and/cleaning of other types of workpieces having similar roughness and film thickness problems.

Figure 6:
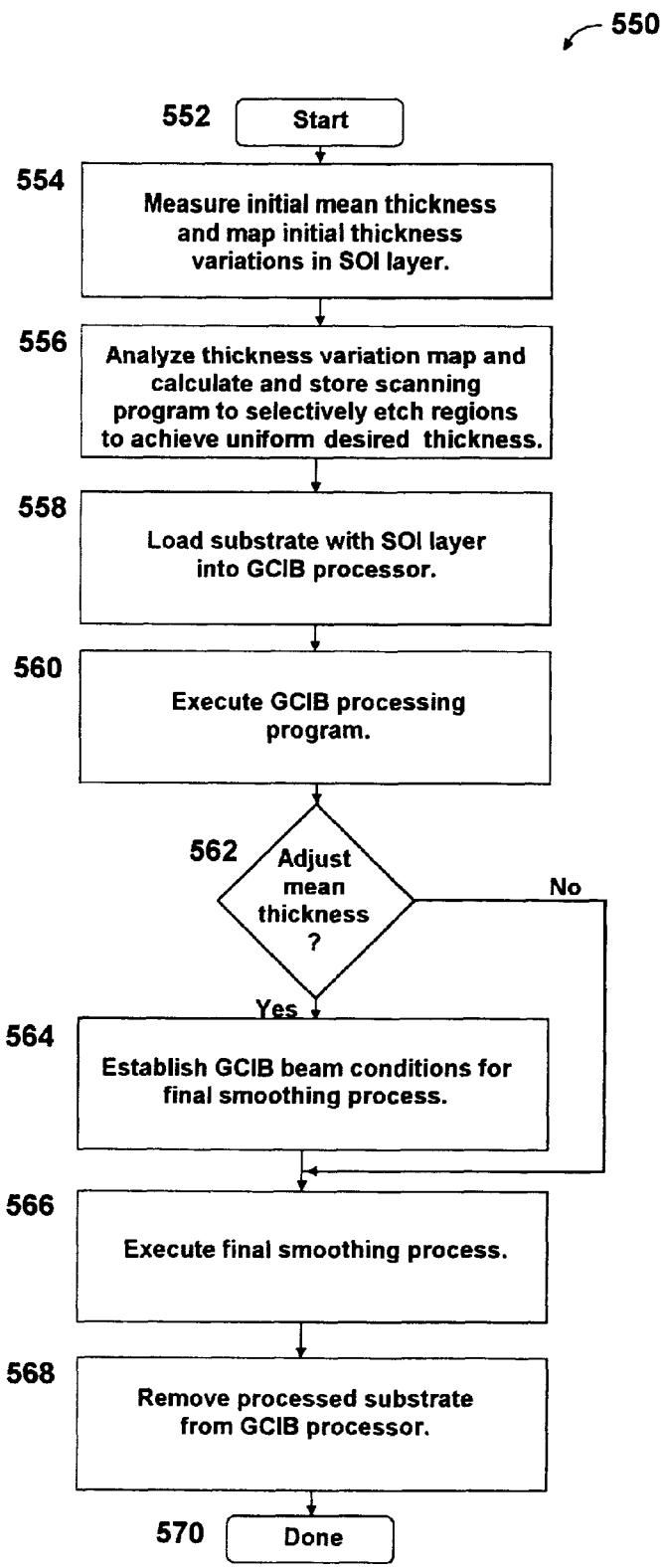
FIG. 6 is a flowchart showing a sequence of actions for monitor and control of the GCIB processing of SOI according to an embodiment of a method of this invention.

FIG. 6 is a flowchart 550 showing the steps for practicing a first embodiment of this method of the invention, wherein the measurement and mapping of the non-uniformity of the top film is measured ex-situ. The step 552 represents the start of the process. In step 554, the initial mean thickness of the top film is measured and the initial thickness variations of the top film are measured as a function of position on the wafer. As previously mentioned, various conventional instrument techniques are capable of such measurements, including, but not limited to, spectroscopic ellipsometry. In step 556, the initial thickness and thickness variation map is analyzed and a processing scan program is calculated to result in GCIB etch processing that improves the uniformity of the thickness of the top film layer. Any additional thickness reduction required to bring the remaining film to desired final thickness is also determined. The parameters of the scan program and additional thinning are stored in the GCIB processing system controller. In step 558, the workpiece (which is preferably an SOI wafer) to be processed is loaded into the GCIB processing apparatus (processing system). In step 560, the processing scan program calculated in step 556 is executed. This is typically done with an energetic (20–50 keV) GCIB for fast etching and moderate smoothing (to Ra ~a few Å). If no additional etching is required to produce the desired final thickness of the top film, at step 562 the process advances to step 566. If additional etching is required to produce the desired final thickness, then the additional etching is performed in step 564. At step 566, the GCIB energy is reduced to a low energy (preferably 1–10 keV), and a final smoothing process is performed. An additional dose at low energy reduces the value of Ra to ~1 Å or less with negligible additional etching. After the final smoothing process, at step 568 the processed substrate is removed from the GCIB processing apparatus. At step 570 the method of the first embodiment of the method of the invention is done.

Figure 7:
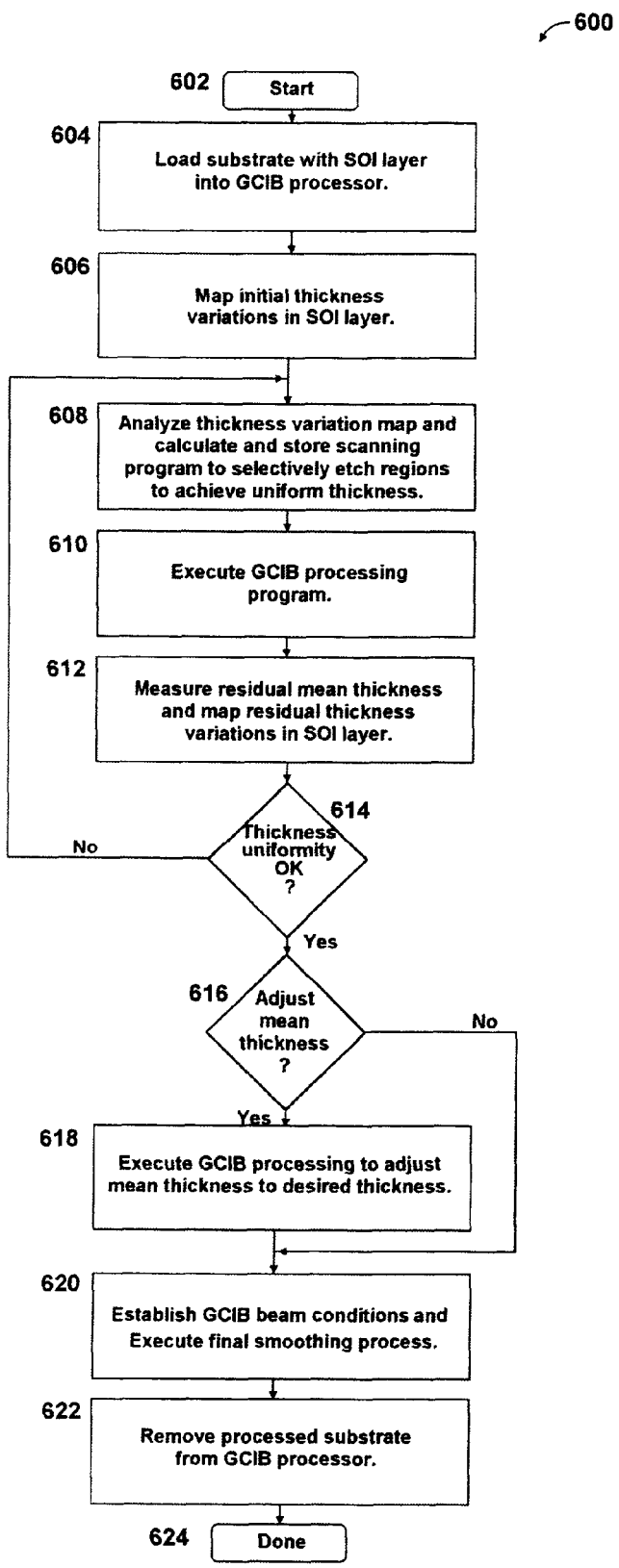
FIG. 7 is a flowchart showing a sequence of actions for monitor and control of the GCIB processing of SOI according to a second embodiment of the method of this invention.

FIG. 7 is a flowchart 600 showing the steps for practicing a second embodiment of the method of this invention, wherein the measurement and mapping of the non-uniformity of the top film is measured in-situ. The step 602 represents the start of the process. In step 604, the workpiece (which is preferably an SOI wafer) to be processed is loaded into the GCIB processing apparatus (processing system). In step 606, the initial thickness variations of the top film are measured as a function of position on the wafer, using, for example, the in-situ optical instrumentation system of the apparatus of the invention, which can be, but is not limited to, a spectroscopic ellipsometry system, for example. In step 608, the thickness variation map is analyzed and a processing scan program is calculated to result in GCIB etch processing that improves the uniformity of the thickness of the top film layer. The parameters of the scan program and additional thinning are stored in the GCIB processing system controller. In step 610, the processing scan program calculated in step 608 is executed. This is typically done with an energetic (20–50 keV) GCIB for fast etching and moderate smoothing (to Ra ~a few Å). In step 612, the residual mean thickness of the top film and the residual thickness variations of the top film as a function of position on the wafer are measured. At step 614, the residual thickness uniformity is compared to the desired level of uniformity. If not satisfactory, the process iterates to step 608. If the residual thickness uniformity is satisfactory, the residual mean thickness measurement is tested at step 616. If the residual mean thickness is satisfactory, no additional etching is required to produce the desired final thickness of the top film and the process continues at step 620. If the residual mean thickness is too large, additional uniformly scanned etching is performed at step 618. This is typically done with an energetic (20–50 keV) GCIB for fast etching and moderate smoothing (to Ra ~a few Å). At step 620, the GCIB energy is reduced to a low energy (preferably 1–10 keV), and a final smoothing process is performed. An additional dose at low energy reduces the value of Ra to ~1 Å or less with negligible additional etching. After the final smoothing process, at step 622 the processed substrate is removed from the GCIB processing apparatus. At step 624 the method of the second embodiment of the method of the invention is done.

A third embodiment of the method of this invention performs processing which alternates between inert GCIB (for example argon) and reactive GCIB (for example, oxygen) treatment and is useful for thin-film processing. When processing SOI, an example reason for using an alternating-gas beam are: (1) under an oxygen beam, the silicon surface is converted into a surface film of SiO2 or SiOX (e.g., for gettering), and (2) under subsequent argon beam the surface will experience the angstrom-level contamination removal, etching and smoothing, thus providing together both smoothing and purification of the surface. Nitrogen or other reactive gases may also be used for the reactive processing portion of this method. This third embodiment of the invention can be utilized with SOI or other wafers with an outer surface of silicon or any material on which a surface film can be grown by GCIB reaction. This embodiment facilitates a two step mechanism of GCIB processing: (A) the silicon surface is chemically converted to SiO2 or similar by the action of the oxygen-clusters to produce an oxide film and (B) this oxide film is then etched by the argon clusters, and may be completely removed. A useful variation on this embodiment combines the use of nitrogen GCIB and argon GCIB. In this variation, the nitrogen clusters will chemically convert the surface silicon into a silicon nitride compound whereupon the argon clusters will be provided by the apparatus to subsequently etch the silicon nitride film.

Figure 8:
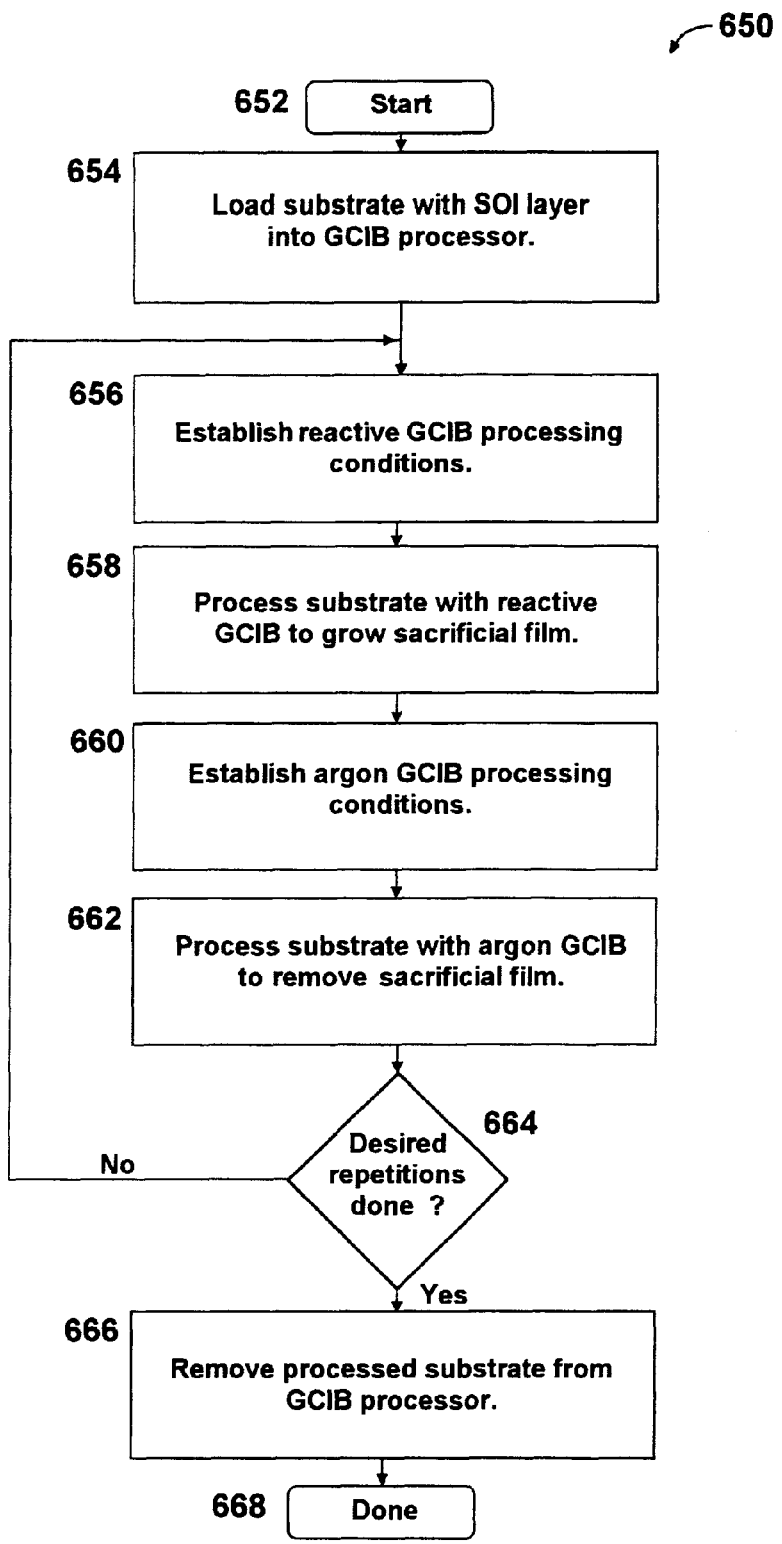
FIG. 8 is a flowchart showing a sequence of actions for multiple gas GCIB processing of SOI according to a third embodiment of the method of this invention.

FIG. 8 is a flowchart 650 showing the steps for practicing the third embodiment of the method of this invention, wherein surface smoothing and surface cleaning are both performed. A GCIB process is used to remove contamination (such as metal species) from the surface, and to improve surface smoothness at the same time. The step 652 represents the start of the process. In step 654, the workpiece (which is preferably an SOI wafer) to be processed is loaded into the GCIB processing apparatus (processing system) having a selectable inert or reactive source gas, as in the GCIB processing apparatus of the invention previously shown in FIG. 4. In step 656, GCIB processing conditions are established for processing with a reactive gas-containing GCIB to react the reactive component in the beam with the surface of the silicon top film. The source gas may be oxygen, nitrogen, carbon dioxide, or another oxygen or nitrogen containing condensable source gas or other reactive condensable source gas. In step 658, the surface of the top film is processed with the reactive GCIB causing the growth of a sacrificial film of oxide or nitride or other reaction product on the surface of the top film. The sacrificial film getters or entraps and immobilizes surface impurities, which may be present on the surface of the workpiece, for subsequent removal. At step 660, the reactive gas flow is replaced with an inert gas flow, for example argon and beam conditions are established for processing with a GCIB comprised of the inert gas. In step 662, the top film of the substrate is processed with the inert GCIB, etching away the sacrificial film previously formed in step 658 and smoothing the surface of the top film. At step 664 a determination is made if a desired number of repetitions have been completed, if not the process is iterated from step 656. When the desired number of iterations are complete, at step 666 the processed substrate is removed from the GCIB processing apparatus. At step 668 the process is complete.

Figure 9:
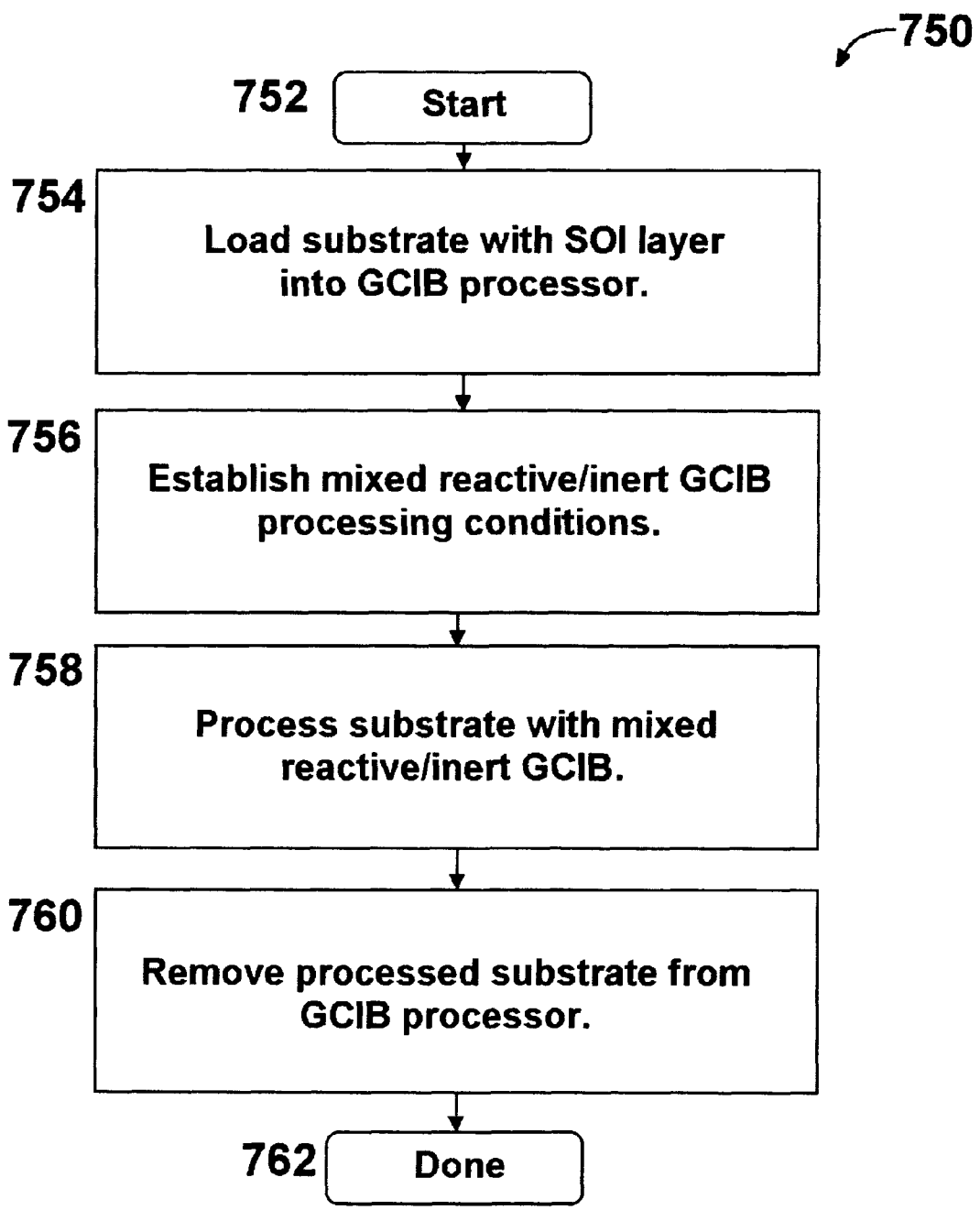
FIG. 9 is a flowchart showing a sequence of actions for monitor and control of the GCIB processing of SOI according to a fourth embodiment of the method of this invention.

It is recognized that as an alternative to iteratively alternating between reactive and inert GCIB processing, as in steps 656 through 664 of FIG. 8, it is possible to use a GCIB containing a predetermined mixture of inert and reactive gases so as to continuously and simultaneously react with surface contaminants and etch them away. FIG. 9 is a flowchart 750 of a fourth embodiment of the processing method of this invention wherein surface smoothing and surface cleaning are both performed by processing with a GCIB with combined inert and reactive components. The step 752 represents the start of the process. In step 754, the workpiece (which is preferably an SOI substrate) to be processed is loaded into the GCIB processing apparatus (processing system) having both an inert and a reactive source gas, as in the GCIB processing apparatus of the invention previously shown in FIG. 4. In step 756, GCIB processing conditions are established for processing with an inert and reactive gas-containing GCIB. Referring to FIG. 4, both the shut-off valves 246 and 248 are opened, admitting a mixture of inert gas 112 from cylinder 111 and reactive gas 252 from cylinder 250 to the source nozzle 110 for production of a mixed GCIB 202. Alternatively, a premixed mixture of inert and reactive gas may be provided in a single cylinder and admitted to the source nozzle through a single shut-off valve. The reactive source gas may be oxygen, nitrogen, carbon dioxide, or another oxygen or nitrogen containing condensable source gas or other reactive condensable source gas. The inert gas may be argon, for example. Referring again to FIG. 9, at step 758, the workpiece (preferably a SOI substrate) is processed with the mixed inert/reactive GCIB so as to continuously and simultaneously react with surface contaminants and etch them away, while smoothing the surface. When the processing is complete, at step 760 the processed workpiece is removed from the GCIB processing apparatus. At step 762 the process of the fourth embodiment of the method of the invention is done.

It is also recognized that another alternative method of this invention is to process the substrate with an inert GCIB while bathing the surface of the substrate with a low-pressure reactive atmosphere.

Figure 10:
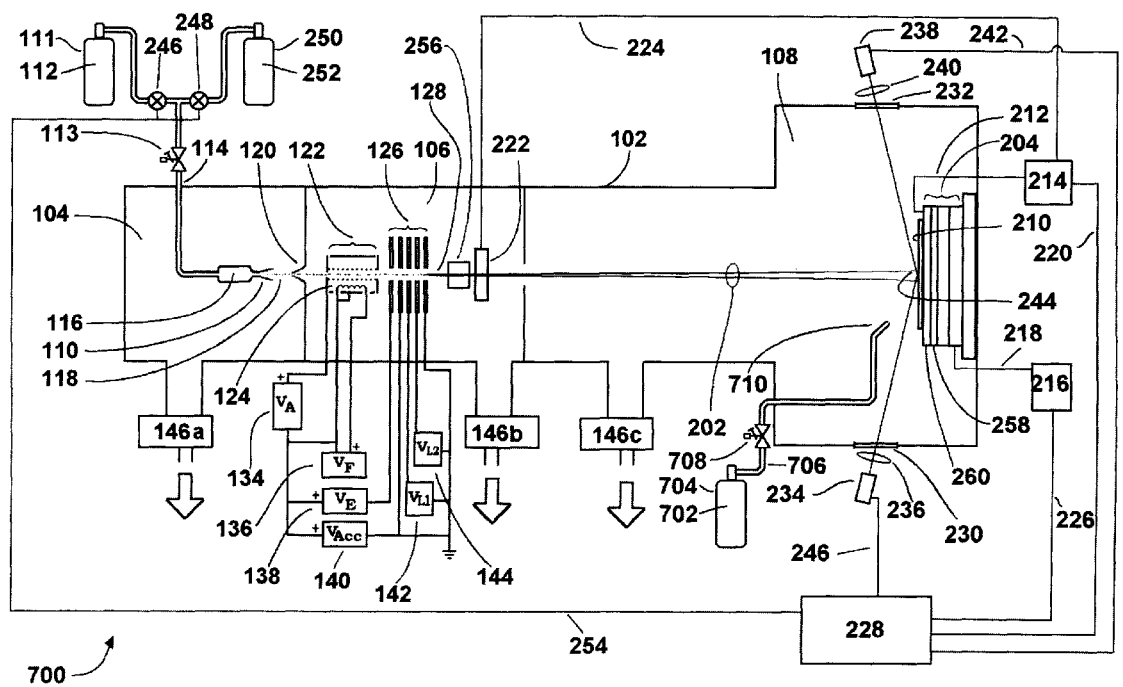
FIG. 10 is a schematic of the GCIB apparatus of the invention with ambient gas control capability for processing SOI wafers.

FIG. 10 is a schematic of a GCIB processing apparatus 700 of the invention having provision for bathing the workpiece 210 in a reactive gas atmosphere during inert GCIB processing. A cylinder 704 contains a reactive gas 702, oxygen, nitrogen, water vapor or an oxygen- or nitrogen-containing gas, for example. A gas delivery tube 706 and a metering valve 708 deliver the reactive gas through a nozzle 710 to the vicinity of the workpiece surface. As the inert GCIB 202 cleans and etches the workpiece surface, the freshly exposed surface reacts readily with the low pressure reactive gas atmosphere, reacting with surface impurities to getter the surface while it is being etched and smoothed. Thus cleaning and purification of the surface is performed simultaneously with inert GCIB etching and/or smoothing.

The initial thickness variations of the top film are measured as a function of position on the wafer, using the in-situ optical instrumentation system of the apparatus of the invention, a spectroscopic ellipsometry system, for example, but not limited thereto. Referring back to FIG. 7, in step 608, the thickness variation map is analyzed and a processing scan program is calculated to result in GCIB etch processing that improves the uniformity of the thickness of the top film layer. The parameters of the scan program and additional thinning are stored in the GCIB processing system controller. In step 610, the processing scan program calculated in step 608 is executed. This is typically done with an energetic (20–50 keV) GCIB for fast etching and moderate smoothing (to Ra~a few Å). In step 612, the residual mean thickness of the top film and the residual thickness variations of the top film as a function of position on the wafer are measured. At step 614, the residual thickness uniformity is compared to the desired level of uniformity. If not satisfactory, the process iterates to step 608. If the residual thickness uniformity is satisfactory, the residual mean thickness measurement is tested at step 616. If the residual mean thickness is satisfactory, no additional etching is required to produce the desired final thickness of the top film and the process continues at step 620. If the residual mean thickness is too large, additional uniformly scanned etching is performed at step 618. This is typically done with an energetic (20–50 keV) GCIB for fast etching and moderate smoothing (to Ra ~a few Å). At step 620, the GCIB energy is reduced to a low energy (preferably 1–10 keV), and a final smoothing process is performed. An additional dose at low energy reduces the value of Ra to ~1 Å or less with negligible additional etching. After the final smoothing process, at step 622 the processed substrate is removed from the GCIB processing apparatus. At step 624 the method of the second embodiment of the method of the invention is done.

Although the invention has been described with respect to various embodiments, it should be realized this invention is also capable of a wide variety of further and other embodiments within the spirit and scope of the invention.

What is claimed is:

1. An apparatus for gas cluster ion beam processing of a workpiece having an initially non-uniform thin film on a surface thereof, the apparatus comprising:
   a vacuum enclosure;
   a gas cluster ion beam source located within the vacuum enclosure for producing a gas cluster ion beam, the gas cluster ion beam having a beam path, a beam intensity and a controllable beam energy;
   means for disposing the workpiece in the path of the gas cluster ion beam for processing;
   means for controllably producing relative scanning motion between the workpiece and the gas cluster ion beam in order to sequentially process different regions on the surface of the workpiece with the gas cluster ion beam; means for storing a data map of non-uniformity of the workpiece; and
   means responsive to the stored data map of non-uniformity for modulating the amount of processing of the surface of the workpiece to modify the surface.

2. The apparatus of claim 1 wherein the non-uniformity of the workpiece is thin film thickness, surface roughness, or surface contamination.

3. The apparatus of claim 1 wherein the surface modification reduces the non-uniformity.

4. The apparatus of claim 1 wherein the surface modification creates specifically intended variations from region to region on the surface of the workpiece.

5. The apparatus of claim 1 wherein the gas cluster ion beam comprises ionized clusters, the ionized clusters being selected from the group consisting of helium, neon, argon, krypton, xenon, nitrogen, oxygen, carbon dioxide, sulfur hexafluoride, nitric oxide, nitrous oxide, and any combination thereof.

6. The apparatus of claim 5 wherein the ionized clusters are argon, cluster size is about 100 to about 10,000 atoms, and the ionized clusters are accelerated through a potential of from about 5 kV to about 50 kV.

7. The apparatus of claim 1 wherein the workpiece is mechanically moved relative to the gas cluster ion beam in order to scan the surface of the workpiece with the gas cluster ion beam.

8. The apparatus of claim 1 wherein the relative motion between the workpiece and the gas cluster ion beam is varied to modulate the amount of processing of the surface of the workpiece.

9. The apparatus of claim 1 wherein the relative motion between the workpiece and the gas cluster ion beam is uniform and the gas cluster ion beam intensity is varied to modulate the amount of processing of the surface of the workpiece.

10. The apparatus of claim 1 wherein the workpiece is a silicon-on-insulator semiconductor wafer having a non-uniform silicon thin film thickness, said uppermost film being on top of at least an insulator layer or film.

11. The apparatus of claim 10 wherein the workpiece consists of monocrystalline silicon fabricated onto a silicon dioxide thin film in turn formed onto a monocrystalline silicon wafer, said fabrication by any of several means including deposition of the oxide and silicon films, formation by implantation of oxygen into a monocrystalline silicon wafer, bonding of two monocrystalline silicon wafers followed by etching back nearly all of one of those wafers, or implantation of hydrogen into a monocrystalline silicon wafer followed by bonding of this wafer to another monocrystalline silicon wafer followed by delamination of excess silicon at the hydrogen implanted layer.

12. The apparatus of claim 1 wherein the means for modulating the amount of processing further comprises a means for varying the gas cluster ion beam source supply gas flow, or means for modulating an ionizer either by varying a filament voltage VF or by varying an anode voltage VA, or means for modulating a lens focus by varying a lens voltage, or means for controllably mechanically blocking a portion of the gas cluster ion beam with a variable beam block, adjustable shutter, or variable aperture.

13. The apparatus of claim 1 further comprising means for measuring and mapping the non-uniformity of the workpiece.

14. The apparatus of claim 13 wherein the measuring means utilizes reflection scattering, diffraction, spectroscopy, or polarization detection using a beam of light, x rays or electrons.

15. The apparatus of claim 13 wherein the measuring means utilizes a scatterometry technique.

16. The apparatus of claim 1 further comprising means for introducing a reactive gas near the workpiece surface for reaction.

17. The apparatus of claim 16 wherein the reactive gas is oxygen, nitrogen, water vapor, an oxygen bearing gas, or a nitrogen bearing gas.

18. An apparatus for gas cluster ion beam processing of a workpiece having an initially non-uniform thin film on a surface thereof, the apparatus comprising:
   a vacuum enclosure;
   a gas cluster ion beam source located within the vacuum enclosure for producing a gas cluster ion beam, the gas cluster ion beam having a beam path, a beam intensity and a controllable beam energy;
   means for disposing the workpiece in the path of the gas cluster ion beam for processing;
   means for controllably moving the gas cluster ion beam relative to the workpiece in order to scan the surface of the workpiece with the gas cluster ion beam;
   means for storing a data map of non-uniformity of the workpiece; and
   means responsive to the stored data map of non-uniformity for modulating the amount of processing of the surface of the workpiece to modify the surface.

19. An apparatus for gas cluster ion beam processing of a workpiece having an initially non-uniform thin film on a surface thereof, the apparatus comprising:
   a vacuum enclosure;
   a gas cluster ion beam source located within the vacuum enclosure for producing a gas cluster ion beam, the gas cluster ion beam having a beam path, a beam intensity and a controllable beam energy;
   means for disposing the workpiece in the path of the gas cluster ion beam for processing;
   means for controllably producing relative motion between the workpiece and the gas cluster ion beam in order to scan the surface of the workpiece with the gas cluster ion beam, wherein said relative motion is varied to modulate the amount of processing of the surface of the workpiece and said variation is accomplished by beam-scan deflection plates being supplied with drive voltages that change non-uniformly with time;
   means for storing a data map of non-uniformity of the workpiece; and
   means responsive to the stored data map of non-uniformity for modulating the amount of processing of the surface of the workpiece to modify the surface.

20. An apparatus for gas cluster ion beam processing of a workpiece having an initially non-uniform thin film on a surface thereof, the apparatus comprising:
   a vacuum enclosure;
   a gas cluster ion beam source located within the vacuum enclosure for producing a gas cluster ion beam, the gas cluster ion beam having a beam path, a beam intensity and a controllable beam energy;
   means for disposing the workpiece in the path of the gas cluster ion beam for processing;
   means for controllably producing relative motion between the workpiece and the gas cluster ion beam in order to scan the surface of the workpiece with the gas cluster ion beam;
   means for storing a data map of non-uniformity of the workpiece;
   means responsive to the stored data map of non-uniformity for modulating the amount of processing of the surface of the workpiece to modify the surface; and
   means for measuring and mapping the non-uniformity of the workpiece, said means for measuring utilizing a spectral ellipsometry technique.

21. An apparatus for gas cluster ion beam processing of a workpiece having an initially non-uniform thin film on a surface thereof, the apparatus comprising:
   a vacuum enclosure;
   a gas cluster ion beam source located within the vacuum enclosure for producing a gas cluster ion beam, the gas cluster ion beam having a beam path, a beam intensity and a controllable beam energy;
   means for disposing the workpiece in the path of the gas cluster ion beam for processing;
   means for controllably producing relative motion between the workpiece and the gas cluster ion beam in order to scan the surface of the workpiece with the gas cluster ion beam;
   means for storing a data map of non-uniformity of the workpiece; and
   means responsive to the stored data map of non-uniformity for modulating the amount of processing of the surface of the workpiece to modify the surface.
   means for measuring and mapping the non-uniformity of the workpiece, wherein said measuring means is outside the vacuum enclosure and performs the measurement through transparent ports in the vacuum enclosure.

22. A method of modifying a surface of a workpiece having a non-uniformity by gas cluster ion beam processing comprising:
   mapping information about the non-uniformity of the workpiece by a measuring technique;
   scanning a gas cluster ion beam across a surface of the workpiece; and
   modulating the gas cluster ion beam processing of the surface of the workpiece according to the mapping information.

23. The method of claim 22 wherein the non-uniformity of the workpiece is thin film thickness, surface roughness, or surface contamination.

24. The method of claim 22 wherein the surface modification reduces the non-uniformity.

25. The method of claim 22 wherein the surface modification creates specifically intended non-uniform variations from region to region on the surface of the workpiece.

26. The method of claim 22 wherein the gas cluster ion beam comprises ionized clusters, the ionized clusters being selected from the group consisting of helium, neon, argon, krypton, xenon, nitrogen, oxygen, carbon dioxide, sulfur hexafluoride, nitric oxide, nitrous oxide, and any combination thereof.

27. The method of claim 26 wherein the ionized clusters are argon, cluster size is about 100 to about 10,000 atoms, and the ionized clusters are accelerated through a potential of from about 5 kV to about 50 kV.

28. The method of claim 22 wherein the step of modulating the gas cluster ion beam processing is accomplished by either varying a beam-scan velocity or modulating the intensity of the gas cluster ion beam across the surface of the workpiece.

29. The method of claim 22 wherein the step of modulating the gas cluster ion beam processing comprises any of time varying a gas cluster ion beam supply-gas flux, or gating an ionizer, or modulating the processing duty cycle by deflecting the gas cluster ion beam off of the surface of the workpiece, or modulating an ion-lens focus, or modulating the position of physical beam blocks or apertures.

30. The method of claim 22 wherein the workpiece is a silicon-on-insulator semiconductor wafer having an uppermost silicon thin film having non-uniform silicon thin film thickness, said uppermost silicon thin film being on top of at least an insulator layer or film.

31. The method of claim 22 wherein the measuring technique utilizes reflection scattering, diffraction, spectroscopy, or polarization detection using a beam of light, x rays or electrons.

32. The method of claim 22 wherein the measuring technique utilizes a scatterometry technique.

33. The method of claim 22 wherein the mapping step is performed within a gas cluster ion beam apparatus.

34. The method of claim 33 further comprising repeating steps of mapping information about the non-uniformity of the workpiece by a measuring technique and modulating the gas cluster ion beam processing of the surface of the workpiece according to the mapping information.

35. The method of claim 22 further comprising introducing a reactive gas near the surface of the workpiece for reaction.

36. The method of claim 35 wherein the reactive gas is oxygen, nitrogen, water vapor, an oxygen bearing gas, or a nitrogen bearing gas.

37. A method of modifying a surface of a workpiece having a non-uniformity by gas cluster ion beam processing comprising:

mapping the non-uniformity of the workpiece by a spectral ellipsometry technique;

directing a gas cluster ion beam toward a surface of the workpiece; and modulating the gas cluster ion beam processing of the surface of the workpiece according to the mapping information.

38. An apparatus for gas cluster ion beam processing of a workpiece having an initially non-uniform thin film on a surface thereof, the apparatus comprising:

a vacuum enclosure;

a gas cluster ion beam source located within the vacuum enclosure for producing a gas cluster ion beam, the gas cluster ion beam having a beam path, a beam intensity and a controllable beam energy;

means for disposing the workpiece in the path of the gas cluster ion beam for processing;

means for controllably producing relative motion between the workpiece and the gas cluster ion beam in order to scan the surface of the workpiece with the gas cluster ion beam;

means for storing a data map of non-uniformity of the workpiece;

means responsive to the stored data map of non-uniformity for modulating the amount of processing of the surface of the workpiece to modify the surface; and means for measuring and mapping the non-uniformity of the workpiece, said means for measuring utilizing a technique that can produce a point-by-point film thickness map that can be reduced to thickness contours.

39. A method of modifying a surface of a workpiece having a non-uniformity by gas cluster ion beam processing comprising:

mapping the non-uniformity of the workpiece by a technique that can produce a point-by-point film thickness map that can be reduced to thickness contours;

directing a gas cluster ion beam toward a surface of the workpiece; and modulating the gas cluster ion beam processing of the surface of the workpiece according to the mapping information.

40. An apparatus for gas cluster ion beam processing of a workpiece, the apparatus comprising:

a vacuum enclosure;

a gas cluster ion beam source located within the vacuum enclosure for producing a gas cluster ion beam, the gas cluster ion beam having a beam path, a beam intensity and a controllable beam energy;

means for disposing the workpiece in the path of the gas cluster ion beam for processing;

means for controllably producing relative motion between the workpiece and the gas cluster ion beam in order to scan the surface of the workpiece with the gas cluster ion beam for spatial variations across the surface of the substrate, wherein the spatial variations occur within a property of the substrate desired to be more uniform;

means for creating a data map of the scanned spatial variations;

means for storing the created data map; and means responsive to the stored data map for substantially continuously processing the surface of the workpiece to reduce the spatial variations across the surface of the substrate.

* * * * *